United States Patent [19]

Oka et al.

[11] Patent Number: 4,867,850
[45] Date of Patent: Sep. 19, 1989

[54] THERMAL DETECTORS AND PROCESS FOR MANUFACTURING THE SAME

[75] Inventors: Syotaro Oka, Muko; Junichi Kita, Kyoto; Hiroki Kuyama, Kyoto; Motosada Kiri, Kyoto, all of Japan

[73] Assignee: Shimadzu Corporation, Kyoto, Japan

[21] Appl. No.: 133,057

[22] Filed: Dec. 15, 1987

[30] Foreign Application Priority Data

Dec. 16, 1986 [JP] Japan ............................. 61-300259
Dec. 16, 1986 [JP] Japan ............................. 61-300260
Dec. 29, 1986 [JP] Japan ............................. 61-311162

[51] Int. Cl.$^4$ ........................... C25D 5/02; G01J 1/00
[52] U.S. Cl. ................................. 204/15; 250/338.3; 250/338.4
[58] Field of Search ............. 204/15; 250/338.3, 338.4

[56] References Cited

U.S. PATENT DOCUMENTS

| | | | |
|---|---|---|---|
| 3,912,451 | 10/1975 | Gaglia | 422/30 |
| 4,475,040 | 10/1984 | Matsumoto et al. | 250/338.3 |
| 4,516,027 | 5/1985 | Schimmelpfe et al. | 204/192.15 |
| 4,595,832 | 6/1986 | La Delfe et al. | 250/338.3 |

Primary Examiner—Stephen J. Kalafut
Attorney, Agent, or Firm—Bryan, Cave, McPheeters & McRoberts

[57] ABSTRACT

Thermal detectors comprising at least one pair of membrane electrodes formed on a base material (such a pyroelectric, semiconductive and insulating materials), wherein at least one member of said pair of electrodes is covered with a black membrane of precious metal formed by the electrolytic process, are highly sensitive because of the excellent heat absorption efficiency, with little change in sensitivity over a wide wavelength range.

13 Claims, 3 Drawing Sheets

THERMAL DETECTORS AND PROCESS FOR MANUFACTURING THE SAME

BACKGROUND OF THE INVENTION

1. Field of the Invention

This invention relates to thermal detectors. More particularly, it relates to thermal radiation detector useful for the detection of infrared rays and temperature, such as pyroelectric infrared sensors, thermopiles or thermistor-bolometers, and to a process for manufacturing the same.

2. Description of the Prior Art

Pyroelectric elements, which can detect changes of surface charges caused by the pyroelectric effect resulted from the temperature rise by the thermal energy of incident infrared rays, have been used as thermal detectors, such as infrared and temperature sensors. Such pyroelectric elements consist of an pyroelectric material and a pair of smooth-surface, membrane electrodes formed on both faces thereof, in which one of the membrane electrodes is used as heat-absorbing face. As the pyroelectric material, is used a ceramic material such as a compound of $Sr_{1-x}Ba_xNb_2O_6$, $Pb_5Ge_3O_{11}$, TGS (triglycine sulfate) and its analogues, $PbTiO_3$, $PbTi_xZr_{1-x}O_3$ or $LiTaO_3$, or an organic compound such as PVDF (polyvinylidene fluoride). Various attempts have been made in order to enhance detection sensitivity: use of a metal layer of higher heat absorption (e.g., Cr and Ni-Cr deposited layers), as the heat-absorbing membrane electrode, in place of the conventional Pt and Au deposited layers; and application of a carbon paste layer by coating, or of a gold black layer by vacuum deposition, on the surface of the conventional Pt or Au deposited layer [W. R. Blevin et al. "Influence of Black Coating on Pyroelectric Detectors", Applied Optics, 13, No. 5, 1171-1178 (1984)].

These techniques, however, have disadvantages of their own. The use of the Cr or Ni-Cr layer is insufficient in heat absorption efficiency because it still has some reflectivity. The layer of gold black deposited on the surface of a membrane electrode is frequently insufficient in heat absorption efficiency and is low in sensitivity particularly in long wavelength regions (10 to 25 $\mu m$). The coated layer of carbon paste tends to be thick, and it is difficult to achieve a thickness less than 1000 $\mu m$. This means an increased thermal capacitance of the whole thermal detector.

In addition, the problem common to all of these is the difficulty in forming a layer exactly on the surface of membrane electrode; metal or carbon paste tends to be deposited or coated on areas outside the electrode surface, causing unevenness in sensitivity.

This invention was accomplished under such circumstances to provide thermal detectors excellent in heat absorption efficiency and in detection sensitivity for infrared rays.

SUMMARY OF THE INVENTION

Intensive studies have led us to find that the heat absorption efficiency and detection sensitivity for long-wavelength rays can be significantly enhanced if the black membrane of precious metal (e.g., gold black and platinum black) is formed on the membrane electrode by the electrolytic process, not by the vacuum deposition process.

Thus, this invention provides thermal detectors comprising at least one pair of membrane electrodes formed on a base material, wherein at least one member of said pair of electrodes is covered with a black membrane of precious metal formed by the electrolytic process.

The thermal detectors of this invention are highly sensitive because of the excellent heat absorption efficiency, and also show little change in sensitivity over a wide wavelength range. In addition, electrodeposition forms the black membrane layer deposited exactly on the surface of the membrane electrode, rarely resulting in unevenness in sensitivity. The manufacturing process is also very simple.

DESCRIPTION OF THE PREFERRED EMBODIMENTS

Figure 1:
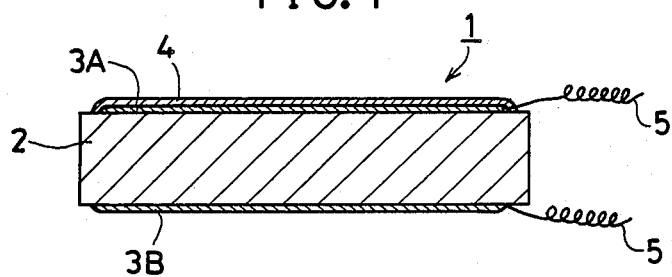
FIG. 1 is a schematic view of a pyroelectric thermal detector of this invention prepared in Example.

As the base material of the thermal detectors of this invention, may be used various types of substances, such as pyroelectric, semiconductive and insulating materials. When a pyroelectric material is used, for example, providing membrane electrodes on both faces thereof gives a pyroelectric thermal detector. Thermistor-bolometers can be prepared in a similar way by using a semiconductor as base material. When an insulating material is used, on the other hand, it is also possible to manufacture thermopiles by providing at least one pair of thermocouple electrodes on one face thereof.

As the pyroelectric material, may be used various types of compounds as mentioned above. Of these, use of $LiTaO_3$, $PbTiO_3$ and PZT—compounds which are not deliquescent—in the form of plates in preferred.

As the semiconductive material, may be used Si and Ge semiconductors, and so-called thermistor semiconductors such as Fe, Co and Ni oxides, while various types of glass plates may be employed as the insulating material.

The most preferred selection is the use of a pyroelectric substance as base material for the manufacture of pyroelectric thermal detectors.

Suitable membrane electrodes used in this invention are deposited or sputtered layers of precious metals, such as Pt and Au, but deposited layers of Cr or Ni-Cr, or thermocouple electrodes, may also be employed. The preferable thickness of these electrode membranes is usually in the range from about 0.1 to about 1.0 $\mu m$.

The black membrane of precious metal herein means a precious metal (such a platinum, gold, palladium and iridium) which exists in a finely porous and spongy form and is dark or black in color. Of various precious metals, platinum black is the most preferred.

The black membrane of precious metal in this invention is formed by electrodeposition using a membrane electrode, formed on a thermal-detector base material as described above, as the electrode for electrolysis. For example, a membrane of platinum black can be formed by immersing the abovementioned thermal detector element (with a membrane electrode provided thereupon) and a counter electrode in an electrolyte solution (an aqueous solution of a platinic acid, e.g., chloroplatinic acids), and applying a voltage so that the membrane electrode will be negative electrode. Similarly, a membrane of gold, palladium or iridium black can be formed by using chloroauric acids, palladium chlorides or iridium chlorides as electrolyte, respectively. The suitable concentration of these precious metal compounds in the solution is usually in the range from 40 to 80 moles. The electrolyte solution may also contain other additives for electrolysis for example, blackening accelerators like lead acetate.

The suitable voltage to be applied to membrane electrode may vary with the electrode area, distance between electrodes, concentration of electrolyte, temperature and other factors, but usually should be set so that the potential of membrane electrode will be in the range from about −0.2 to about −0.8 V (vs. AgAgCl).

The thickness of deposited black membrane of precious metal can be easily controlled by adjusting electrolysis time and should preferably be in the range from about 2 to about 50 μm.

We have found that black membranes of precious metal with outstanding characteristics can be formed if the potential of membrane electrode is initially set at a level in the range from about −0.4 to about −0.7 V (vs. Ag/AgCl) and then changed to a level in the range from about −0.2 to about −0.4 V in the later stage (2-step electrolysis). Electrolysis should preferably be continued for 20 to 60 seconds in the first step and for 30 to 60 seconds in the second step. Surface analysis by means of a scanning electron microscope (SEM) revealed that the black membranes of precious metal obtained by this 2-step electrolyis have such a fine surface unevenness that the protruded areas are arranged at pitches of about 2 to about 40 μm and the depth of the recessed areas is in the range from about 3 to about 12 μm. The absorption efficiency for infrared rays (2.5 to 25 μm) is well balanced over the whole wavelength range (high efficiency also observed in long and short wavelength regions), with the overall absorption efficiency being 90% or more. The thermal capacitance of these black membranes is also very low. It was also demonstrated that still higher absorption efficiency can be achieved with black membranes where the protruded areas are uniformly arranged at a pitch in the range from about 3 to about 12 μm, preferably about 3 to about 7 μm.

This black membrane of precious metal is electrodeposited on at least one of the membrane electrodes formed on heat-absorbing faces. In the manufacture of a pyroelectric thermal detector, for example, the black membrane is deposited on one of a pair of membrane electrodes formed on both faces of pyroelectric element. In such cases, electrolysis is conducted by applying a voltage only upon the electrode to be treated, but the black membrane of precious metal tends to be deposited also on the other electrode to a greater or lesser extent, thus adversely affecting the sensitivity of thermal detector and the effective formation of intended black membrane. In order to avoid this trouble, the membrane electrode not to be electrocoated with precious metal black has to be protected with a masking agent, such as paraffin wax, during electrolysis, or this membrane electrode has to be formed after the electrodeposition of precious metal. As a solution to this problem, we have found that the abovementioned trouble can be avoided if an inverse voltage is applied during electrolysis to the membrane electrode not to be electrocoated. The preferable inverse voltage is such that the potential at membrane electrode will be in the range from about +1.0 to −0.2 V (vs. Ag/AgCl).

The invention will become more apparent from the following Examples and accompanying drawings.

EXAMPLE 1

Figure 2:
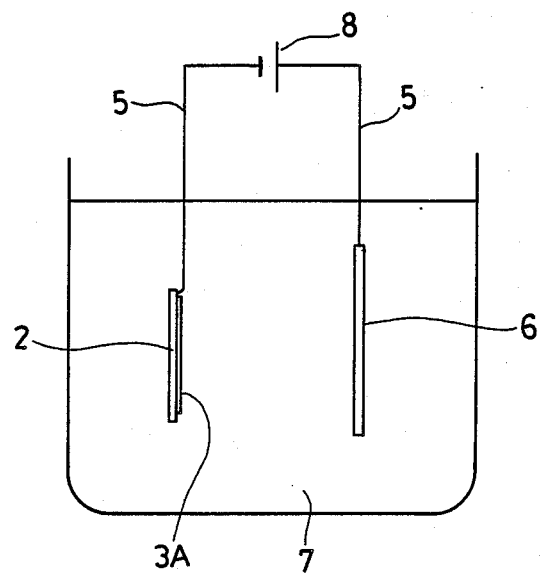
FIGS. 2, 3 and 6 are schematic views illustrating the manufacturing steps for the thermal detectors described in Example.

A platinum membrane (membrane electrode), about 0.4 μm in thickness and about 1 mm$^2$ in area, was formed by sputtering on one face of a LiTaO$_3$ pyroelectric element (1.0×1.2×8 μm), and a gold lead wire was connected to the terminal thereof. This element was immersed in a 57.9 mM aqueous solution of hexachloroplatinic (IV) acid containing 10 mg of lead (II) acetate (electrolyte solution) to form an electrolytic system as shown in FIG. 2, in which 2 is pyroelectric element, 3A is platinum membrane, 6 is platinum counter electrode (10×20×1.00 mm), 7 is electrolyte solution, 8 is constant-voltage power source, and 5 is gold lead wire.

Electrolysis at a voltage of 1.30 V over a period of 40 seconds formed a platinum black membrane about 10 μm thick on one face of Pt membrane 3A. A membrane electrode was formed on the back face in a similar way, giving thermal detector 1 of this invention as shown in FIG. 1 (4 is platinum black membrane).

Its heat absorption efficiency was evaluated by measuring the IR reflection ratio at the heat-absorbing area. Measurement was made by means of FT-IR (Fourier-transform IR spectrophotometer) at an incident-light angle of about 60° to 90°, and the reflection ratio was calculated from the following equation using the reflected light spectrum from an aluminum mirror as reference:

$$\alpha = \frac{\text{Reflected light intensity from test element}}{\text{Reflected light intensity from } Al \text{ mirror}}$$

The heat absorption efficiency of the above platinum black membrane for 2.5 to 25 μm infrared rays was found to be about 85%.

EXAMPLE 2

Figure 3:
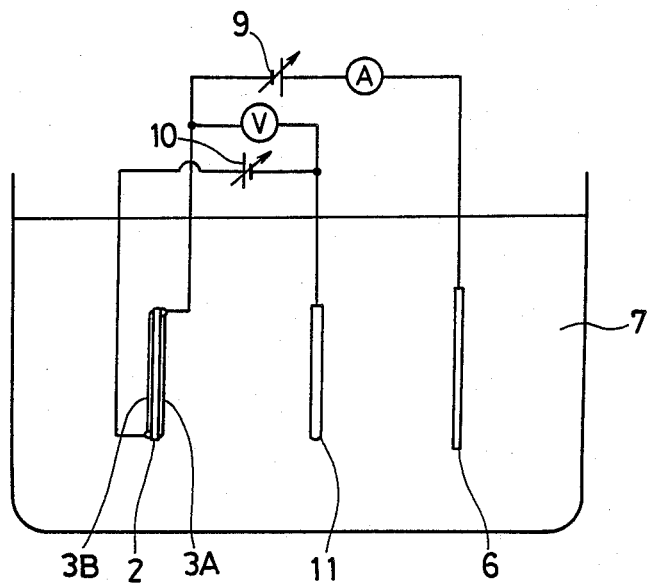

A platinum membrane (membrane electrode), about 0.4 μm in thickness and about 1 mm$^2$ in area, was formed by sputtering on both faces of a LiTaO$_3$ pyroelectric element (1.0 ×1.2×8 μm), and a gold lead wire was connected to the terminal thereof. This element was immersed in a 57.9 mM aqueous solution of chloroplatinic acid containing 10 mg of lead acetate (electrolyte solution) to form an electrolytic system as shown in FIG. 3, in which 11 is reference electrode (Ag/AgCl) for potential monitoring, 9 is power source to supply electrolytic voltage across platinum membrane 3A and counter electrode 6, and 10 is inverse voltage power source to supply inverse voltage to platinum membrane 3B (back face).

Electrolysis was continued at room temperature for one minute with no agitation while controlling power sources 9 and 10 so that the potential of platinum membrane 3A will be −0.3 V and that of platinum membrane 3B will be +0.1 V. As a result, thermal detector 1 as shown in FIG. 1 was obtained, in which a uniform platinum black membrane about 10 μm thick was formed on membrane 3A, with no platinum black membrane formed on membrane 3B. Its heat absorption efficiency for 2.5 to 25 μm infrared rays was found to be about 90%.

In contrast, when electrolysis was conducted by the conventional method with no inverse voltage impressed to platinum membrane 3B, nonuniform formation of platinum black was observed on membrane 3B and uniformity of platinum black membrane deposited on membrane 3A was also insufficient.

EXAMPLE 3

Figure 6:
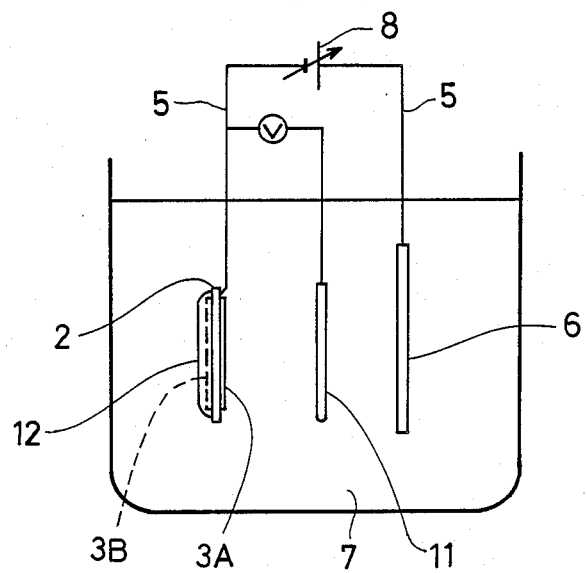

Three grams of hexachloroplatinic (VI) acid ($H_2PtCl_6.6H_2O$) was mixed with about ten milligrams of lead (II) acetate, the mixture was dissolved in water to make up 100 ml, and this solution was used as electrolyte solution. Electrolysis was conducted as shown in FIG. 6 using, as working electrode, one face of $LiTaO_3$ pyroelectric element (both faces were coated with platinum as membrane electrode as in Example 2), with the back face of said element being protected with paraffin wax 12 (Apiezone Wax; product of Nikka Seiko Co., Ltd.). Platinum was used as counter electrode and an Ag/AgCl electrode was employed as reference electrode. Electrolysis was carried out in two steps: (1) at room temperature for 20 seconds with the potential of working electrode set at −0.4 V; and (2) for 40 seconds with the potential maintained at −0.2 V. The thickness of platinum black membrane formed on the working electrode was 12 to 17 μm. SEM analysis showed that it has a fine surface unevenness uniformly spread over the entire area, with the protruded portions being arranged at pitches of 3 to 7 μm and the depth of the recessed portions being 3 to 12 μm. Such surface unevenness has been found to cause irregular reflection of electromagnetic waves in the infrared region, thus making a black surface, and to ensure highly efficient thermal absorption.

Figure 4:
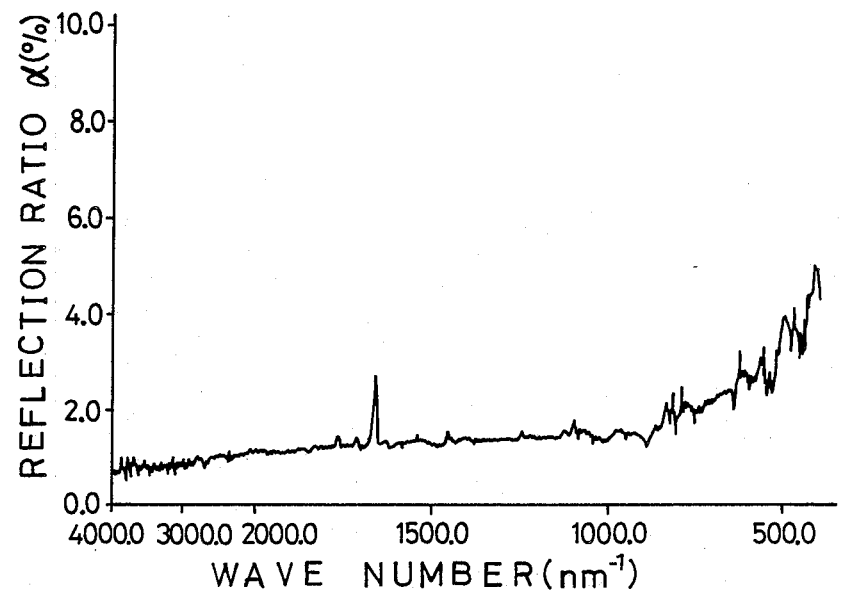
FIG. 4 is a graph showing the IR reflection ratio of a thermal detector prepared in Example.
Figure 5:
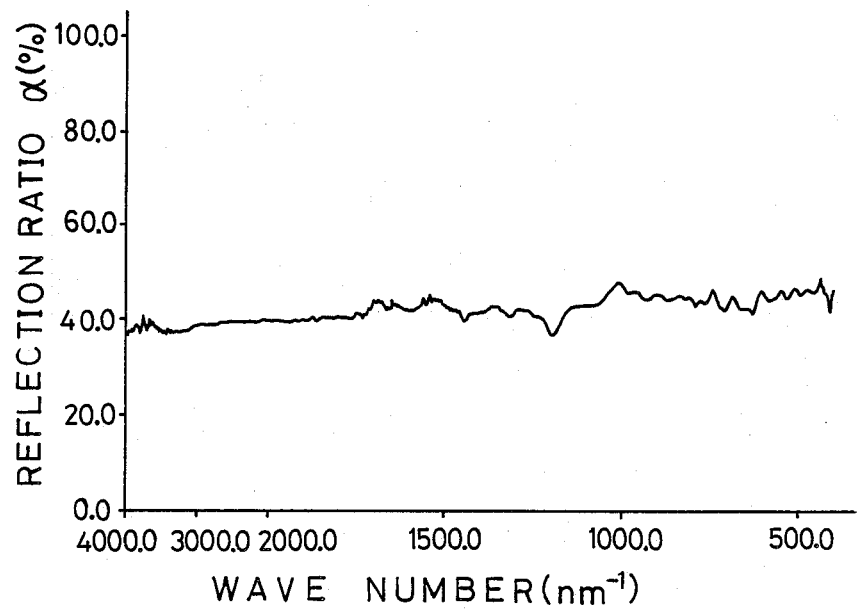
FIG. 5 is a graph showing the IR reflection ratio of the thermal detector prepared in Comparative Example.

The IR reflection ratio of this platinum black membrane was measured in the same manner as in Example 1, and the result obtained is shown in FIG. 4. As can be estimated from the figure, the overall heat absorption efficiency was 95%, with the value for 2.5 μm infrared rays amounting to about 99%. For comparison, the data for a commercial thermal detector comprising DLATGS (L-alanine doped TGS) with a Cr membrane coated thereupon as membrane electrode is shown in FIG. 5. The heat absorption efficiency of this commercial product was about 64%. This clearly shows that the thermal detector of this Example has high IR absorption efficiency over a wide infrared range and hence provides an infrared detector and thermosensor with high S/N ratio and sensitivity.

What is claimed is:

1. A thermal detector comprising at least one pair of membrane electrodes formed on a base material, wherein at least one member of said pair of electrodes is covered with a black membrane of a precious metal formed by an electrolytic process, said black membrane having fine surface unevenness such that each protruded area has a pitch of about 3 to about 7 μm.

2. The thermal detector as defined in claim 1 wherein the base material is made of a pyroelectric, semiconductive or insulating material.

3. The thermal detector as defined in claim 1 wherein the base material is made of a pyroelectric material.

4. The thermal detector as defined in claim 3, wherein the pyroelectric material is a ceramic material selected from the group consisting of $Sr_{1-x}Ba_xNb_2O_6$, $Pb_5Ge_3O_{11}$, triglycine sulfate and its analogues, $PbTiO_3$, $PbTi_xZr_{1-x}O_3$ and $LiTaO_3$.

5. The thermal detector as defined in claim 1 wherein the black membrane of precious metal is gold black, platinum black, palladium black or iridium black.

6. The thermal detector as defined in claim 1 wherein the thickness of the black membrane of precious metal is in the range from about 2 to about 50 μm.

7. The thermal detector as defined in claim 1 wherein the black membrane of precious metal has been formed by the electrolytic process with the potential of substrate membrane electrode being set at level in the range from about −0.2 to about −0.8 V (vs. Ag/AgCl).

8. The thermal detector as defined in claim 7 wherein the potential of precious metal membrane is initially set at a level in the range from about −0.4 to −0 7 V (vs Ag/AgCl) and then changed to a level in the level in the range from about −0.2 to −0.4 V (vs. Ag/AgCl) in the later stage.

9. The thermal detector as defined in claim 1, wherein the membrane electrodes are deposited with a film of gold, platinum, or chromium.

10. The thermal detector as defined in claim 1 wherein the thickness of the membrane electrodes is in the range from about 0.1 to about 1.0 μm.

11. The thermal detector as defined in claim 3, wherein the pyroelectric material is an organic compound.

12. The thermal detector as defined in claim 11, wherein said organic compound is polyvinylidene fluoride.

13. The thermal detector as defined in claim 9, wherein the membrane electrodes are deposited with a film of nickel-chromium.

* * * * *

UNITED STATES PATENT AND TRADEMARK OFFICE
CERTIFICATE OF CORRECTION

PATENT NO. : 4,867,850

DATED : Sept. 19, 1989

INVENTOR(S) : Oka et al.

It is certified that error appears in the above-identified patent and that said Letters Patent is hereby corrected as shown below:

Col. 3, line 18: change "$A_g A_g Cl$" to --Ag/AgCl--.

Col. 6, line 32: delete "in the level"

Signed and Sealed this

Ninth Day of February, 1993

Attest:

STEPHEN G. KUNIN

*Attesting Officer*      Acting Commissioner of Patents and Trademarks